US010090465B2

(12) United States Patent
Hsu et al.

(10) Patent No.: US 10,090,465 B2
(45) Date of Patent: Oct. 2, 2018

(54) SEMICONDUCTOR DEVICE HAVING MEMORY CELL STRUCTURE AND METHOD OF MANUFACTURING THE SAME

(71) Applicant: UNITED MICROELECTRONICS CORP., Hsinchu (TW)

(72) Inventors: Chia-Ching Hsu, Lunbei Township (TW); Liang Yi, Singapore (SG); Shen-De Wang, Zhudong Township (TW); Ko-Chi Chen, Taoyuan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 59 days.

(21) Appl. No.: 15/359,975

(22) Filed: Nov. 23, 2016

(65) Prior Publication Data

US 2018/0108837 A1 Apr. 19, 2018

(30) Foreign Application Priority Data

Oct. 19, 2016 (TW) .............................. 105133718 A

(51) Int. Cl.
*H01L 45/00* (2006.01)

(52) U.S. Cl.
CPC ........ *H01L 45/1675* (2013.01); *H01L 45/085* (2013.01); *H01L 45/1233* (2013.01); *H01L 45/1266* (2013.01); *H01L 45/146* (2013.01)

(58) Field of Classification Search
CPC ............... H01L 45/1675; H01L 45/085; H01L 45/1233
See application file for complete search history.

(56) References Cited

U.S. PATENT DOCUMENTS

| 7,833,898 | B2 | 11/2010 | Lee | |
|---|---|---|---|---|
| 9,431,603 | B1 * | 8/2016 | Hsieh | .................... H01L 45/085 |
| 9,461,245 | B1 * | 10/2016 | Yang | ................... H01L 45/1253 |
| 9,653,682 | B1 * | 5/2017 | Chou | .................. H01L 27/2436 |
| 9,847,481 | B2 * | 12/2017 | Chang | ................. H01L 45/1253 |
| 9,876,167 | B2 * | 1/2018 | Dang | .................. H01L 45/1233 |
| 2013/0168628 | A1 | 7/2013 | Hwang | |
| 2015/0147864 | A1 | 5/2015 | Liao et al. | |
| 2015/0194602 | A1 * | 7/2015 | Liao | ..................... H01L 45/146 257/4 |
| 2015/0255718 | A1 | 9/2015 | Liu et al. | |
| 2015/0287918 | A1 | 10/2015 | Dang et al. | |
| 2015/0295172 | A1 | 10/2015 | Sung et al. | |
| 2015/0311435 | A1 | 10/2015 | Liu et al. | |
| 2015/0349250 | A1 | 12/2015 | Chang et al. | |

(Continued)

*Primary Examiner* — Errol Fernandes
(74) *Attorney, Agent, or Firm* — WPAT, PC

(57) ABSTRACT

A semiconductor device is provided, including a lower conducting layer formed above a substrate, an upper conducting layer, and a memory cell structure formed on the lower conducting layer (such as formed between the lower and upper conducting layers). The memory cell structure includes a bottom electrode formed on the lower conducting layer and electrically connected to the lower conducting layer, a transitional metal oxide (TMO) layer formed on the bottom electrode, a TMO sidewall oxides formed at sidewalls of the TMO layer, a top electrode formed on the TMO layer, and spacers formed on the bottom electrode. The upper conducting layer is formed on the top electrode and electrically connected to the top electrode.

24 Claims, 7 Drawing Sheets

(56) References Cited

U.S. PATENT DOCUMENTS

| 2016/0035975 | A1  | 2/2016 | Chen et al. |
| 2016/0049584 | A1* | 2/2016 | Dang ............... H01L 45/08 |
| | | | 257/4 |
| 2016/0064664 | A1* | 3/2016 | Dang ............ H01L 45/1233 |
| | | | 257/4 |
| 2016/0118583 | A1  | 4/2016 | Chang et al. |
| 2017/0117467 | A1* | 4/2017 | Chang ............... H01L 45/08 |

* cited by examiner

SEMICONDUCTOR DEVICE HAVING MEMORY CELL STRUCTURE AND METHOD OF MANUFACTURING THE SAME This application claims the benefit of TW application Serial No. 105133718, filed Oct. 19, 2016, the subject matter of which is incorporated herein by reference.

BACKGROUND

Technical Field

The disclosure relates in general to a semiconductor device, and more particularly to a semiconductor device having improved memory cell structures.

Description of the Related Art

Reduction of feature size, improvements of the rate, the efficiency, the density and the cost per integrated circuit unit are the important goals in the semiconductor technology. The electrical properties of the device have to be maintained even improved (ex: with the decrease of the size) to meet the requirements of the commercial products in applications. Also, the layers and components with defects, such as position misalignment or incomplete profiles, would have considerable effects on the electrical performance of the device.

For example, a resistive random-access memory (ReRAM) embedded in a semiconductor device fabricated in back end of line (BEOL) interconnect stack has several issues, such as exposure of the interconnect layer (ex: exposure of Cu via) during memory etching; alignment/landing shift of contacts (ex: metal via) on the top electrode of memory which leads to top electrode (TE)-bottom electrode (BE) bridge or damages to the transitional metal oxide layer between TE and BE; and thickness inconsistence between adjacent pairs of metal line and related contact.

SUMMARY

The disclosure is directed to a semiconductor device having memory cell structures, which is capable of improving the properties and performance of the semiconductor device.

According to one aspect of the present disclosure, a semiconductor device is provided, including a lower conducting layer formed above a substrate, an upper conducting layer, a memory cell structure formed on the lower conducting layer (between the lower and upper conducting layers). The memory cell structure comprises a bottom electrode formed on and electrically connected to the lower conducting layer; a transitional metal oxide (TMO) layer formed on the bottom electrode; a TMO sidewall oxides formed at sidewalls of the TMO layer; a top electrode formed on the TMO layer; and spacers formed on the bottom electrode. The upper conducting layer is formed on and electrically connected to the top electrode.

According to another aspect of the present disclosure, a semiconductor device is provided, including a lower conducting layer formed above a substrate, an upper conducting layer, a memory cell structure formed on the lower conducting layer (between the lower and upper conducting layers). The memory cell structure comprises a bottom electrode formed on and electrically connected to the lower conducting layer; a transitional metal oxide (TMO) layer formed on the bottom electrode; a top electrode formed on the TMO layer; and spacers formed on the bottom electrode, wherein the bottom surfaces of the spacers are formed on and directly contact a top surface of the bottom electrode.

DETAILED DESCRIPTION

Figure 1:
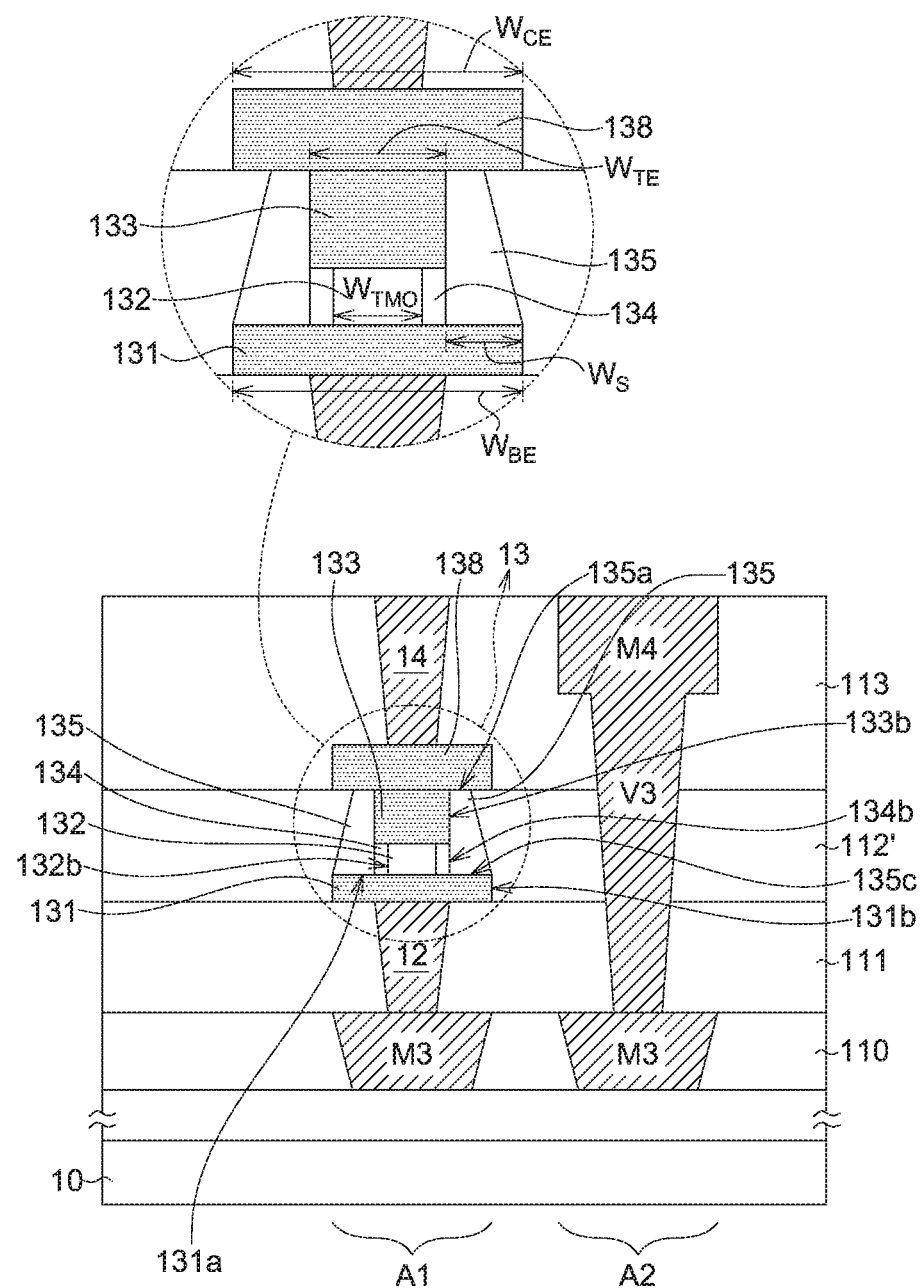
FIG. 1 simply depicts a semiconductor device having a memory cell structure according to the first embodiment of the present disclosure.

In the embodiments of the present disclosure, a semiconductor device having memory cell structures is provided. The memory cell structure of the embodiment is formed in back end of line (BEOL) stack for integration interconnect, and embedded between an upper conducting layer and a lower conducting layer. For example, the embodied memory cell structure can be embedded between an upper contact via and a lower contact via or between the upper and lower metal lines. The semiconductor device of the embodiment can be implemented in the ReRAM (resistive random-access memory) application. Configuration of the embodied semiconductor device with memory cell structure not only effectively prevents the electrodes bridge of the memory cell and cell damage during formation of the via or metal line above the memory cell, but also solves the exposure issue of the lower conducting layer (such as copper via) beneath the memory cell during fabrication of the memory cell, thereby improving the properties and performance of the semiconductor device. Moreover, the proposed structure of the present embodiments not only significantly improves performance of the semiconductor device, but also is compatible with the current fabrication process of the semiconductor device, which is suitable for mass production.

Several embodiments are provided hereinafter with reference to the accompanying drawings for describing the related configurations of memory cell structure and the method for manufacturing the same. Related structural details, such as layers and spatial arrangement, are further described in the embodiments as below. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

First Embodiment

FIG. 1 simply depicts a semiconductor device having a memory cell structure according to the first embodiment of the present disclosure. In one practical application, a semiconductor device includes a first region A1 such as a cell region comprising at least a memory cell, and a second region A2 such as a logic region comprising a logic circuit embedded in the insulating layers. In practical application, a semiconductor device may include several memory cell structures; however, FIG. 1 (and the proposed drawings of the embodiments hereinafter) only schematically shows one memory cell structure for the purpose of clear demonstration.

According to one embodiment, a semiconductor device is provided, comprising a lower conducting layer 12 formed above a substrate 10, an upper conducting layer 14, and a memory cell structure 13 formed between the lower conducting layer 12 and the upper conducting layer 14. The memory cell structure 13 comprises a bottom electrode 131, a transitional metal oxide (TMO) layer 132, a top electrode 133, the TMO sidewall oxides 134 and the spacers 135. The bottom electrode 131 is formed on the lower conducting layer 12 and electrically connected to the lower conducting layer 12. The transitional metal oxide (TMO) layer 132 is formed on the bottom electrode 131, and the TMO sidewall oxides 134 is formed at the sidewalls 132a of the TMO layer 132. The top electrode 133 is formed on the TMO layer 132, and the spacers 135 are formed on the bottom electrode 131. According to the embodiment, the bottom surfaces 135c of the spacers 135 are formed on and directly contact a top surface 131a of the bottom electrode 131.

As shown in FIG. 1, the TMO sidewall oxides 134 are formed between the TMO layer 132 and the spacers 135, and shielded by the top electrode 133. In one embodiment, the spacers 135 (such as nitride spacers) are formed adjacent to the sidewalls of the TMO layer 132, and cover the TMO sidewall oxides 134 and the sidewalls 133b of the top electrode 133. The outer walls 134b of the TMO sidewall oxides 134 are substantially aligned with the sidewalls 133b of the top electrode 133. Also, the spacers 135 formed on the bottom electrode 131 uncover the sidewalls 131b of the bottom electrode 131.

According to the configuration of an embodied memory cell structure, a width $W_{TMO}$ of the TMO layer 132 is smaller than a width $W_{TE}$ of the top electrode 133. Also, in one embodiment, a width $W_{BE}$ of the bottom electrode 131 is larger than a width $W_{TE}$ of the top electrode 133, and is further larger than a width $W_{TMO}$ of the TMO layer 132.

Additionally, in the first embodiment, the memory cell structure further comprises a capping electrode 138 formed on and directly contacting the top electrode 133, wherein the upper conducting layer 14 is formed on and electrically connected to the capping electrode 138. As shown in FIG. 1, the capping electrode 138 covers (ex: contacts and completely shields) the top surfaces 135a of the spacers 135. In one embodiment, the width $W_{CE}$ of the capping electrode 138 is substantially equal to the width $W_{BE}$ of the bottom electrode 131. Also, in one embodiment, the width $W_{CE}$ of the capping electrode 138 is larger than the width $W_{TE}$ of the top electrode 133. The capping electrode 138 can be made of the same material for forming the top electrode 133, or other suitable conducting material.

TMO can be made by a single material or a combination of multiple materials. Material examples of TMO include, but not limited to, HfOx, TaOx, Ta$_2$O$_5$, TiOx, NiOx, AlOx and others transition metal oxides. For example, the TMO can be made by a combination of TaOx and Ta$_2$O$_5$; however, the disclosure is not limited to the exemplified materials as listed above. The electrode can be made by a single material or a combination of multiple materials. Material examples of the electrodes (ex: the top electrode 133 and the bottom electrode 131) include, but not limited to, TiN, TaN, Pt, Ir, or other suitable conducting materials. For example, the electrode can be made by TiN and Pt, or made by TiN and Ir, or other suitable conducting materials; however, the disclosure is not limited to the exemplified materials as listed above.

According to one embodiment, the memory cell structure 13 is formed between the lower conducting layer 12 and the upper conducting layer 14, wherein the lower conducting layer 12 can be (but not limited to) a lower contact via connected to a lower metal line layer (i.e. the third metal line M3 in FIG. 1), and the lower contact via is filled with a conductive material, such as copper (Cu). In one embodiment, the conductive material (ex: Cu) in the lower contact via is different from a material of the bottom electrode 131. Also, the upper conducting layer 14 can be (but not limited to) an upper contact via (ex: filled with conductive material such as Cu) connected to an upper metal line layer (ex: the fourth metal line).

Moreover, in one application, the BEOL stack includes several interconnect layers, and each interconnect layer may comprise a conductive via (ex: contact via) and a conductive line (ex: metal line). Although, it is illustrated that the memory cell structure of FIG. 1 (and the proposed drawings of the embodiments hereinafter) is formed between the third interconnect layer (i.e. the pair of the third contact via (abbreviated as "V3") and the third conductive line (abbreviated as "M3")) and the fourth interconnect layer (i.e. the pair of the fourth contact via (V4) and the fourth conductive line (M4)), the present disclosure is not limited thereto. It is noted that the memory cell structure of the embodiment can be formed between any adjacent interconnect layers, such as formed between the second and third interconnect layers (ex: between "M2/V1" and "M3/V2"), or between the fourth and fifth interconnect layers (ex: between "M4/V3" and "M5/V4"), etc. Position of the memory cell structure of the embodiment can be varied and determined according to the requirements of practical application.

Additionally, although FIG. 1 (and the proposed drawings of the embodiments hereinafter) illustrates that the upper conducting layer 14 above the embodied memory cell structure is an upper contact via (ex: filled with conductive material such as Cu) connected to the top electrode 133 of the memory cell structure, the present disclosure is not limited to this configuration. In some applications, the upper conducting layer 14 could be an upper metal line layer (i.e. without forming contact) directly connected to the top electrode 133 of the memory cell structure.

FIG. 2A-FIG. 2I illustrate a method for manufacturing a semiconductor device having a memory cell structure according to the first embodiment of the present disclosure.

Figure 2A:
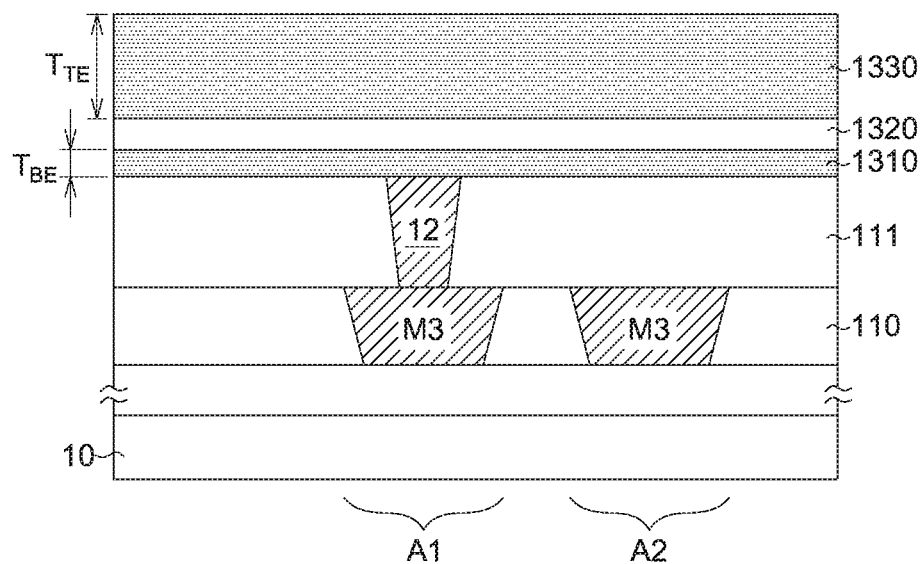
FIG. 2A-FIG. 2I illustrate a method for manufacturing a semiconductor device having a memory cell structure according to the first embodiment of the present disclosure.

As shown in FIG. 2A, a semiconductor device having a lower conducting layer 12 formed above a substrate 10 is provided, wherein a third metal layer M3 (embedded in an IMD layer 110) is formed at the first region A1 (for constructing a memory cell structure subsequently) and the second region A2 (ex: forming logic circuit), and a bottom electrode layer 1310 followed by a TMO deposition layer 1320 and a top electrode layer 1330 are deposited on the lower conducting layer 12 and the insulating layer 111 (such as an inter-metal dielectric layer IMDn_1). In the first embodiment, a lower contact via (ex: filled with copper, and can be referred as a bottom electrode-via (BE-VIA)) is exemplified as the lower conducting layer 12. In one example, the bottom electrode layer 1310 has a thickness $T_{BE}$ of about 100 Å to 500 Å, and the top electrode layer 1330 has a thickness $T_{TE}$ optionally greater than about 1000 Å for providing portion consumed during etching and top electrode polishing (ex: CMP) procedures performed later (i.e. $T_{TE}>T_{BE}$). The thickness of the TMO deposition layer 1320 varies depending on the requirements of the practical applications; for example, to satisfy different requirements of different ReRAM. It is noted that those thickness values of related layers are provided only for exemplification, not for limitation.

Figure 2B:
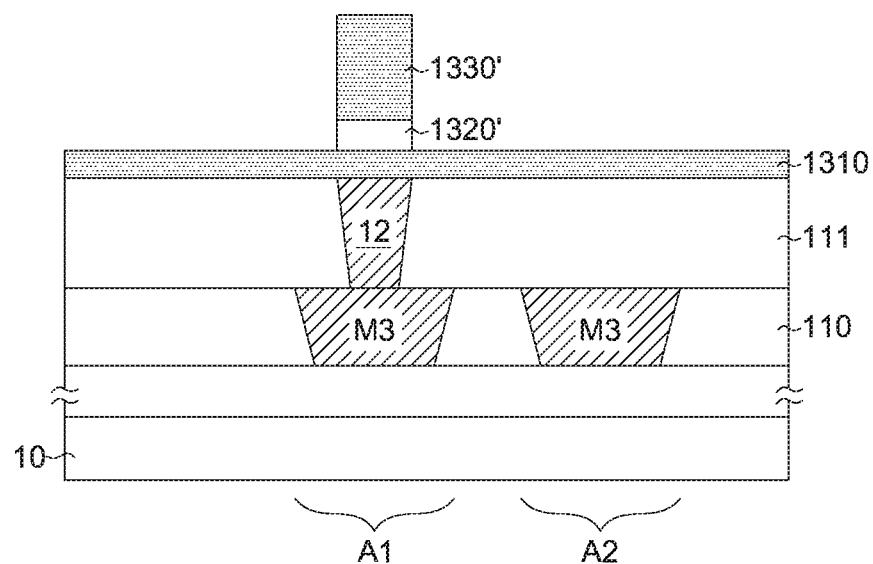

Memory cell lithography is performed. As shown in FIG. 2B, the TMO deposition layer 1320 and the top electrode (TE) layer 1330 are patterned to form a TMO-TE stack on the bottom electrode layer 1310.

Figure 2C:
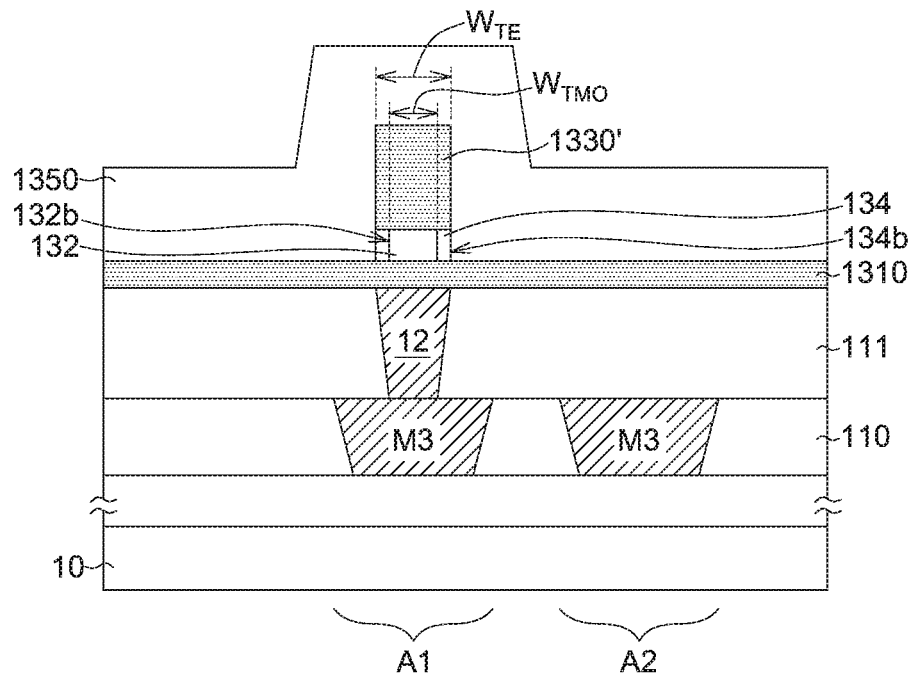

A sidewall oxidation is conducted to form a TMO sidewall oxides 134 at the sidewalls 132a of the TMO layer 132, as shown in FIG. 2C. Also, a spacer material layer 1350 such as a silicon nitride layer is deposited on the bottom electrode layer 1310 and covers the patterned top electrode (TE) layer 1330', the TMO layer 132 and the TMO sidewall oxides 134. In one example, a thickness of the spacer material layer 1350 is (but not limited to) about 1000 Å.

Figure 2D:
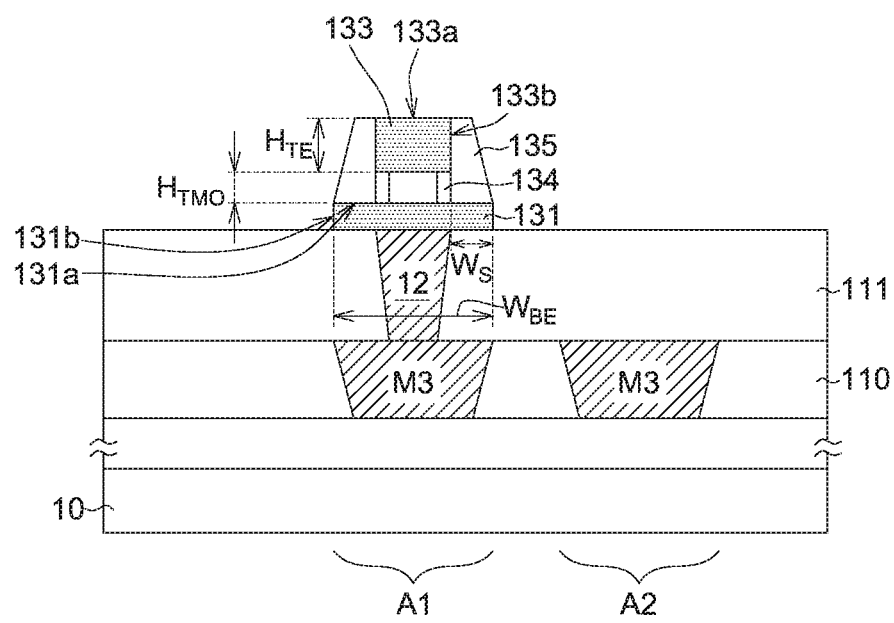

Then, the spacer material layer 1350 is patterned (ex: by etching) to form the spacers 135, followed by defining the bottom electrode 131 (ex: by etching the bottom electrode layer 1310) of the embodied memory cell structure, as shown in FIG. 2D. According to the embodiment, the width $W_{BE}$ of the bottom electrode 131 is larger than the width $W_{TE}$ of the top electrode 133, and the width $W_{TE}$ of the top electrode 133 is larger than the width $W_{TMO}$ of the TMO layer 132. Moreover, in one embodiment, the width $W_S$ of the spacer 135 (at one side of the TE) is about 20% to 80% of a total height of the TMO layer 132 and the top electrode 133 (i.e. the height $H_{TMO}$ of the TMO layer 132 and the height $H_{TE}$ of the top electrode 133). In another embodiment, the width $W_S$ of the spacer 135 (at one side of the TE) is about 20% to 80% of a total height of the TMO layer 132 and the top electrode 133. Accordingly, the configuration and manufacturing method of the embodied memory cell structure greatly reduce the risk of contact via (i.e. the lower conducting layer 12) exposure.

Figure 2E:
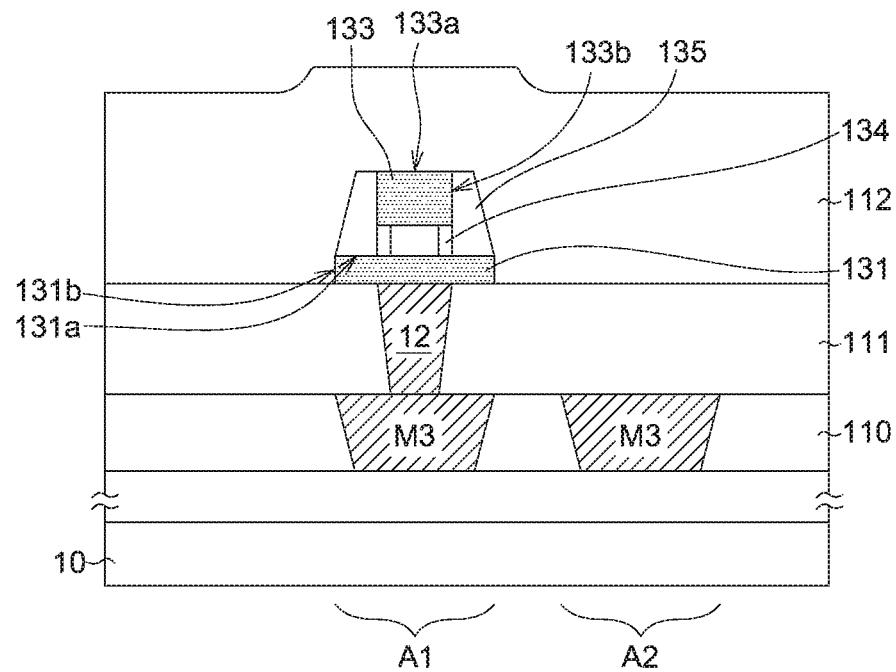
Figure 2F:
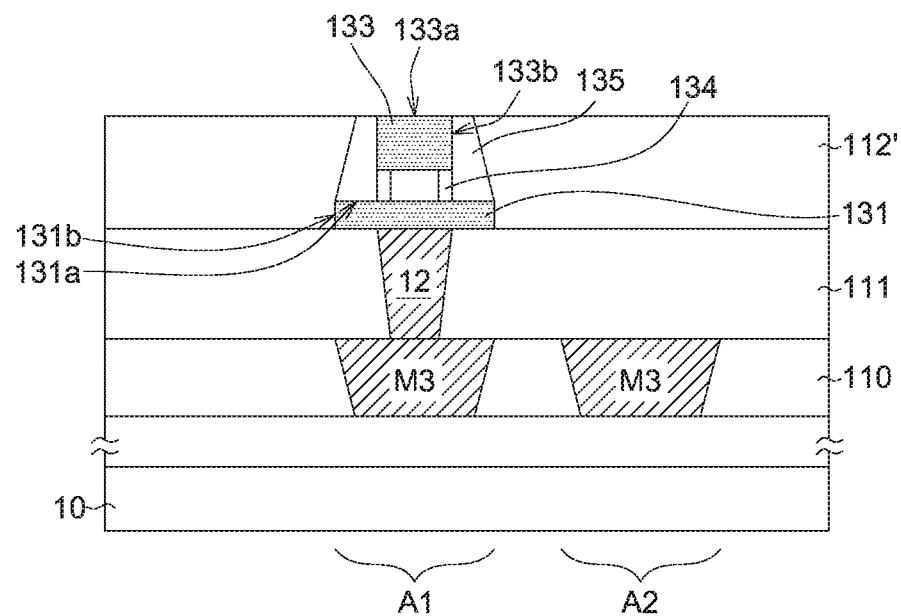

Afterwards, a dielectric layer 112 (such as another inter-metal dielectric layer IMDn_2) is deposited on the insulating layer 111 (such as an inter-metal dielectric layer IMDn_1), and covers the embodied memory cell structure, as shown in FIG. 2E. In one embodiment, the dielectric layer 112 is an oxide layer. Then, the dielectric layer 112 is partially removed by chemical mechanical polishing (CMP), and the polishing procedure stops on the top electrode 133 (ex: TiN) for exposing the top surface 133a of the top electrode 133, as shown in FIG. 2F.

Figure 2G:
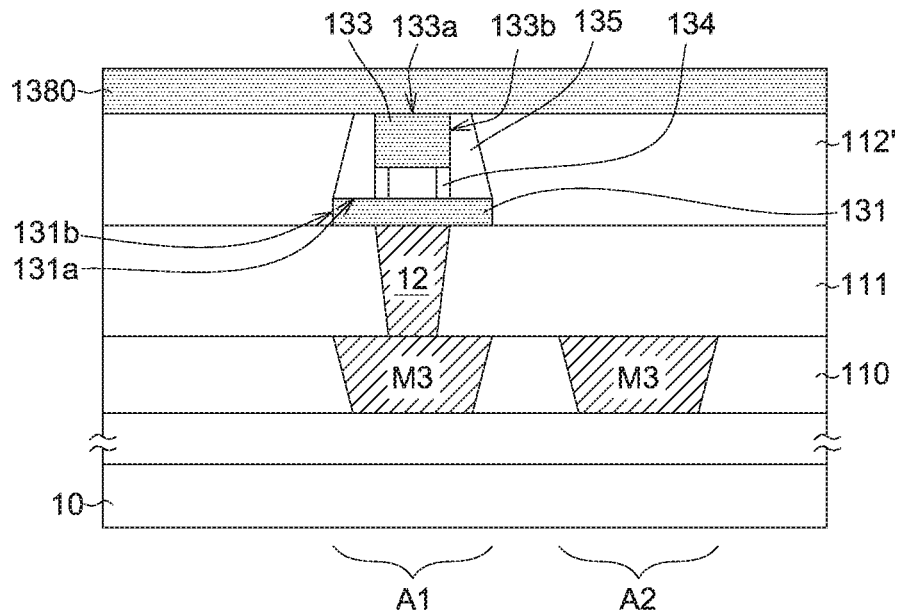
Figure 2H:
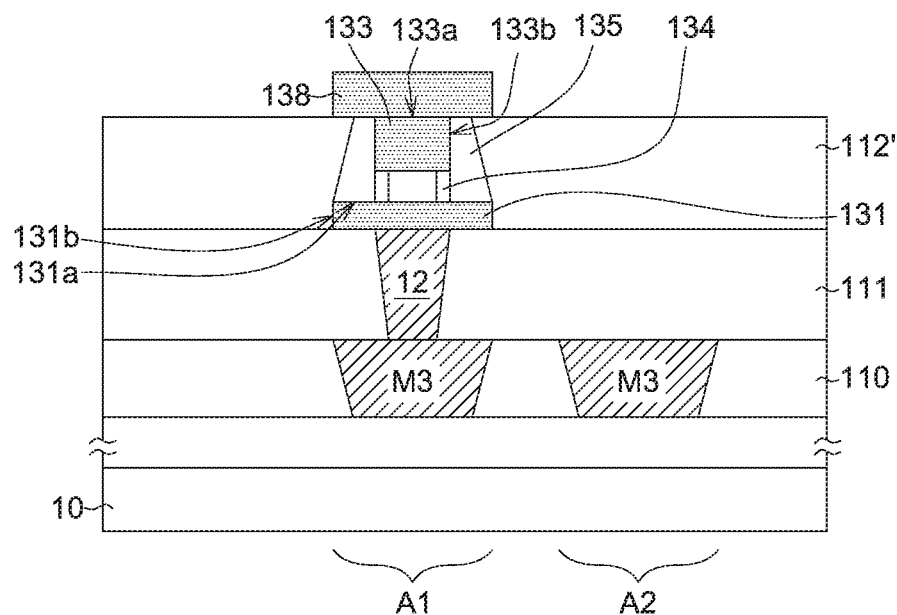

In the first embodiment, a capping electrode 138 is optionally formed on and directly contacting the top electrode 133, as described above. FIG. 2G shows a capping layer 1380 is formed on the top electrode 133, and FIG. 2H shows formation of the capping electrode 138 after patterning the capping layer 1380. The capping electrode 138 preferably shields the spacers 135, and the width $W_{CE}$ of the capping electrode 138 is larger than a sum of the width $W_{TE}$ of the top electrode 133 and the widths of the top surfaces of the spacers 135. In one embodiment, the width $W_{CE}$ of the capping electrode 138 is substantially equal to (but not limited to) the width $W_{BE}$ of the bottom electrode 131. The width $W_{CE}$ of the capping electrode 138 can be adjusted and determined according to the different applications to ensure the complete profile of the embodied memory cell structure.

Figure 2I:
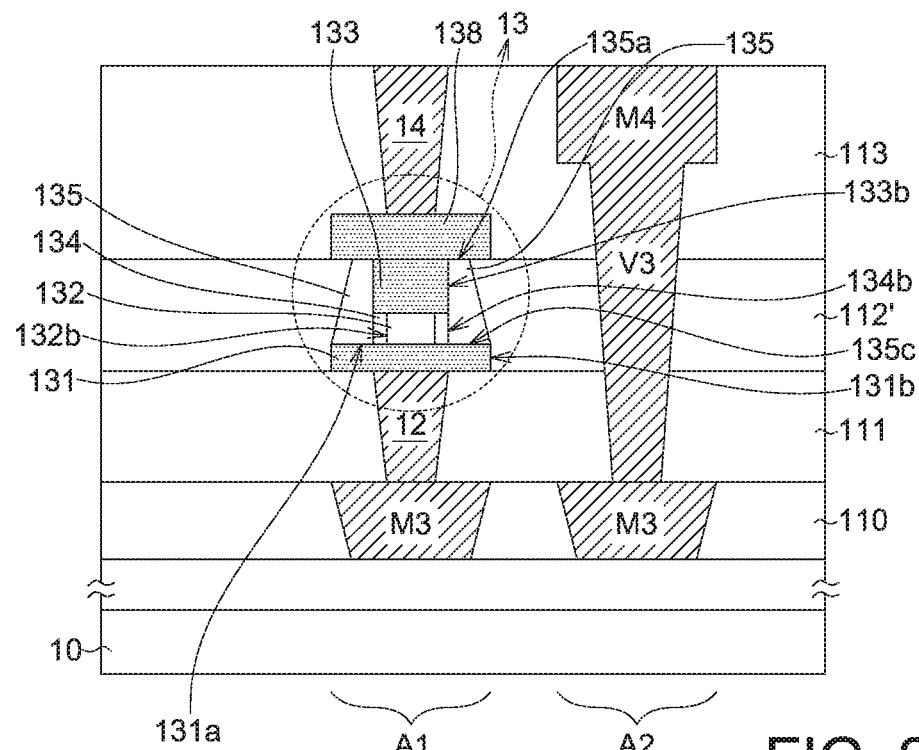

Afterwards, another IMD layer 113 (such as an inter-metal dielectric layer IMDn_3) is deposited, followed by a performing a copper dual-damascene (DD) fabrication process, so as to form an upper conducting layer 14 such as an upper contact via (ex: filled with copper) or upper metal line above the memory cell structure 13 in the first region A1 and a copper DD interconnect (ex: M4+V3) in the second region A2, as shown in FIG. 2I.

According to the embodied memory cell structure, the electrical properties and performance of the semiconductor device in the application can be significantly improved. In the fabrication of memory cell, the etching procedure for pattering the top electrode, the TMO layer and the bottom electrode use $Cl_2$ or HBr gas for better selectivity. However, $Cl_2$ of HBr gas also causes damage to the copper (ex: material for filling vias) if the lower conducting layer (ex: contact via) made by copper is exposed during the fabrication. Therefore, according to the embodied memory cell structure, the width $W_{BE}$ of the bottom electrode 131 is larger than a width $W_{TE}$ of the top electrode 133, so that the exposure issue of the lower conducting layer 12 (such as Cu via, via for connecting the bottom electrode of the memory cell) can be solved. Moreover, according to the embodiment, formations of the TMO sidewall oxides 134 and the spacers 135 (ex: the spacers are formed adjacent to the sidewalls of the TMO layer 132, and cover the TMO sidewall oxides 134 and the sidewalls 133b of the top electrode 133) prevent the top electrode-bottom electrode (TE-BE) bridge and TMO damage if alignment/landing shift of the upper conducting layer 14 (ex: upper contact via) occurs during fabrication.

Second Embodiment

Figure 3:
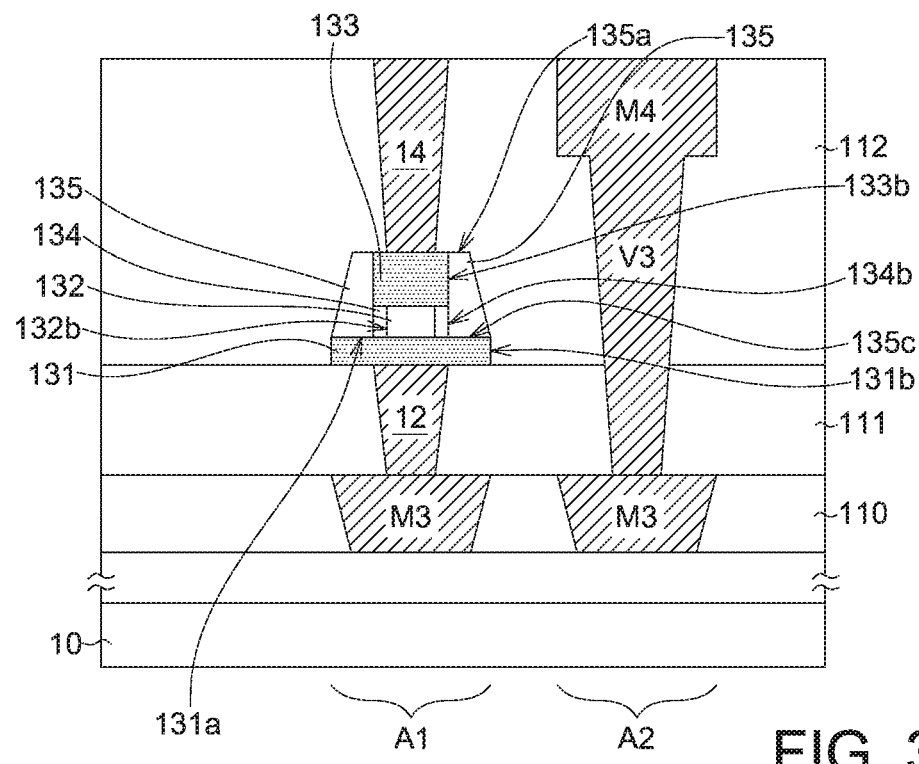
FIG. 3 depicts a semiconductor device having a memory cell structure according to the second embodiment of the present disclosure.

Please refer to FIG. 3, which depicts a semiconductor device having a memory cell structure according to the second embodiment of the present disclosure. The identical and/or similar elements of the second and first embodiments are designated with the same and/or similar reference numerals, and the details of the configurations and fabricating steps of the identical components/layers are not redundantly described. Please also refer to FIG. 1. The semiconductor device of the second embodiment is identical to the semiconductor device of the first embodiment, except for the elimination of the capping electrode 138 on the top electrode 133. In the second embodiment, the upper conducting layer 14 (ex: an upper contact via filled with conductive material such as Cu) formed on the embodied memory cell 13 directly contacts the top electrode 133 of the memory cell structure. Also, in the second embodiment, the dielectric layer 112 is not partially removed by chemical mechanical polishing (CMP), and the copper dual-damascene (DD) is formed in the dielectric layer 112.

Third Embodiment

Figure 4:
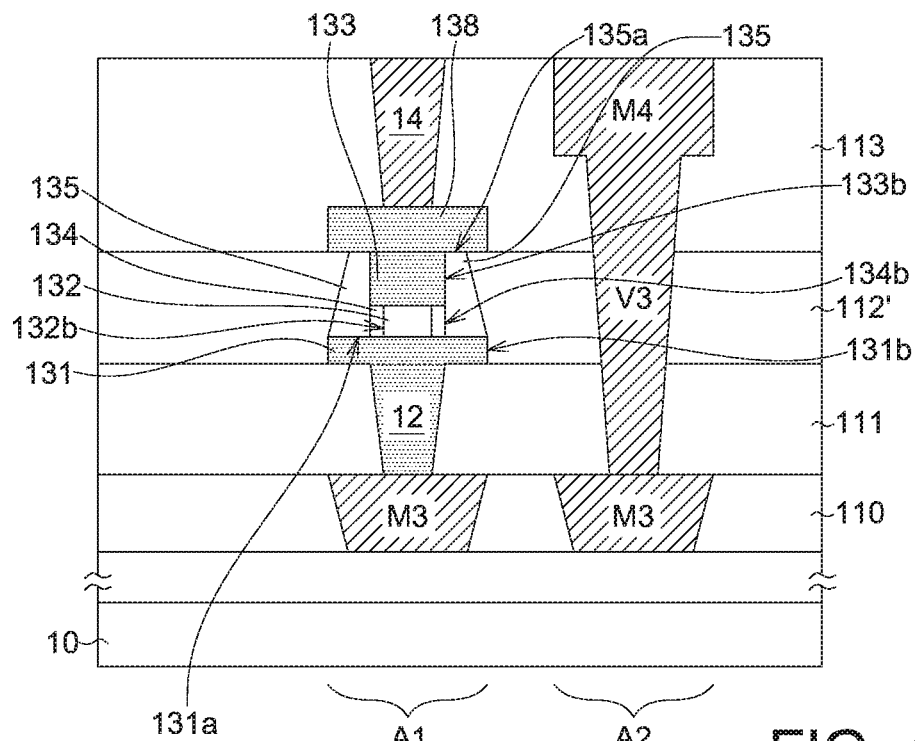
FIG. 4 depicts a semiconductor device having a memory cell structure according to the third embodiment of the present disclosure.

FIG. 4 depicts a semiconductor device having a memory cell structure according to the third embodiment of the present disclosure. The identical and/or similar elements of the third and first embodiments are designated with the same and/or similar reference numerals, and the details of the configurations and fabricating steps of the identical components/layers are not redundantly described. Please also refer to FIG. 1. The semiconductor device of the third embodiment is identical to the semiconductor device of the first embodiment, except for the material for filling the lower conducting layer 12. In the first embodiment, the lower conducting layer 12 below the embodied memory cell 13 is an lower contact via filled with material (such as Cu) different from the material of the bottom electrode 131.

However, the present disclosure is not limited thereto. In the third embodiment, the conductive material in the lower contact via (i.e. the lower conducting layer 12) is the same as a material of the bottom electrode 131.

Fourth Embodiment

Figure 5:
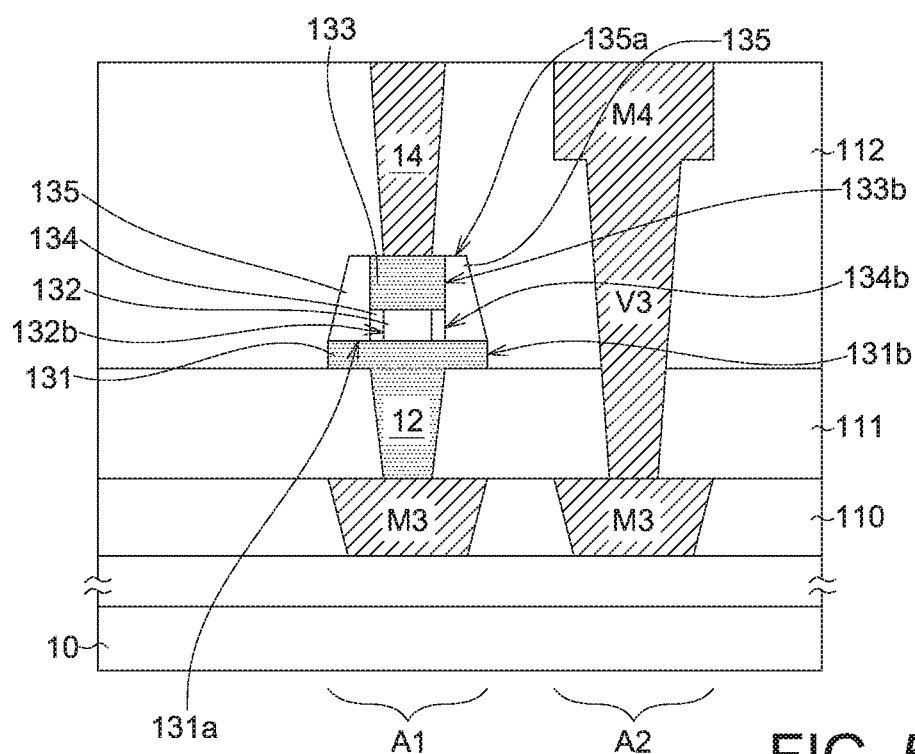
FIG. 5 depicts a semiconductor device having a memory cell structure according to the fourth embodiment of the present disclosure.

FIG. 5 depicts a semiconductor device having a memory cell structure according to the fourth embodiment of the present disclosure. The identical and/or similar elements of the fourth and second embodiments are designated with the same and/or similar reference numerals, and the details of the configurations and fabricating steps of the identical components/layers are not redundantly described. Please also refer to FIG. 3. The semiconductor device of the fourth embodiment is identical to the semiconductor device of the second embodiment, except for the material for filling the lower conducting layer 12. In the second embodiment, the lower conducting layer 12 below the embodied memory cell 13 is an lower contact via filled with material (such as Cu) different from the material of the bottom electrode 131. However, the present disclosure is not limited thereto. In the fourth embodiment, the conductive material in the lower contact via (i.e. the lower conducting layer 12) is the same as a material of the bottom electrode 131. In the second and fourth embodiments, no capping electrode 138 is formed on the top electrode 133 of the semiconductor devices, and the upper conducting layers 14 directly contact the top electrodes 133 of the memory cell structures. Also, in the fourth embodiment, the dielectric layer 112 is not partially removed by chemical mechanical polishing (CMP), and the copper dual-damascene (DD) is formed in the dielectric layer 112.

According to the aforementioned descriptions, the semiconductor device of the embodiment(s) possesses many advantages. For applying the embodied memory cell structure, the width $W_{BE}$ of the bottom electrode 131 is larger than a width $W_{TE}$ of the top electrode 133, so that the exposure issue of the lower conducting layer 12 (such as contact via for connecting the bottom electrode of the memory cell, possibly damaged by the etching agent) can be solved. Moreover, according to the embodiment, formations of the TMO sidewall oxides 134 and the spacers 135 (ex: the spacers are formed adjacent to the sidewalls of the TMO layer 132, and cover the TMO sidewall oxides 134 and the sidewalls 133b of the top electrode 133) prevent the top electrode-bottom electrode (TE-BE) bridge and TMO damage if alignment/landing shift of the upper conducting layer 14 (ex: upper contact via) occurs during fabrication. Accordingly, configuration of the embodied semiconductor device with memory cell structure does significantly improve the electrical properties and performance of the semiconductor device. Also, the manufacturing method of the embodied memory cell structure is compatible with the current fabrication process of the semiconductor device, which is suitable for mass production.

Other embodiments with different configurations of known elements in the semiconductor device can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising
    a lower conducting layer, formed above a substrate;
    a memory cell structure, formed on the lower conducting layer, and the memory cell structure comprising:
        a bottom electrode, formed on and electrically connected to the lower conducting layer;
        a transitional metal oxide (TMO) layer, formed on the bottom electrode;
        a TMO sidewall oxides, formed at sidewalls of the TMO layer and formed on the bottom electrode, wherein bottom surfaces of the TMO sidewall oxides are formed on and directly contact a top surface of the bottom electrode;
        a top electrode, formed on the TMO layer; and
        spacers, formed on the bottom electrode; and
        an upper conducting layer, formed on and electrically connected to the top electrode.

2. The semiconductor device according to claim 1, wherein the spacers are formed adjacent to the sidewalls of the TMO layer, and cover the TMO sidewall oxides and sidewalls of the top electrode.

3. The semiconductor device according to claim 2, wherein outer walls of the TMO sidewall oxides are substantially aligned with the sidewalls of the top electrode.

4. The semiconductor device according to claim 1, wherein bottom surfaces of the spacers are formed on and directly contact the top surface of the bottom electrode.

5. The semiconductor device according to claim 1, wherein the spacers formed on the bottom electrode uncover sidewalls of the bottom electrode.

6. The semiconductor device according to claim 1, wherein a width of the TMO layer is smaller than a width of the top electrode.

7. The semiconductor device according to claim 1, wherein a width of the bottom electrode is larger than a width of the top electrode.

8. The semiconductor device according to claim 1, wherein a width of the bottom electrode is larger than a width of the TMO layer.

9. The semiconductor device according to claim 1, wherein the memory cell structure further comprises:
    a capping electrode formed on and directly contacting the top electrode,
    wherein the upper conducting layer is formed on and electrically connected to the capping electrode.

10. The semiconductor device according to claim 9, wherein a width of the capping electrode is larger than a width of the top electrode.

11. The semiconductor device according to claim 9, wherein the capping electrode covers top surfaces of the spacers.

12. The semiconductor device according to claim 9, wherein the width of the capping electrode is equal to a width of the bottom electrode.

13. The semiconductor device according to claim 1, wherein the lower conducting layer is a lower contact via connected to a lower metal line layer, and the lower contact via is filled with a conductive material.

14. The semiconductor device according to claim 13, wherein the conductive material in the lower contact via is different from a material of the bottom electrode.

15. The semiconductor device according to claim 13, wherein the conductive material in the lower contact via is the same as a material of the bottom electrode.

16. The semiconductor device according to claim 1, wherein the upper conducting layer is an upper contact via connected to an upper metal line layer.

17. The semiconductor device according to claim 1, wherein the upper conducting layer is an upper metal line layer.

18. A semiconductor device, comprising
a lower conducting layer, formed above a substrate;
a memory cell structure, formed on the lower conducting layer, and the memory cell structure comprising:
  a bottom electrode, formed on and electrically connected to the lower conducting layer;
  a transitional metal oxide (TMO) layer, formed on the bottom electrode;
  a top electrode, formed on the TMO layer; and
  spacers, formed on the bottom electrode, wherein bottom surfaces of the spacers are formed on and directly contact a top surface of the bottom electrode; and
an upper conducting layer, formed on and electrically connected to the top electrode.

19. The semiconductor device according to claim 18, wherein the spacers formed on the bottom electrode uncover sidewalls of the bottom electrode.

20. The semiconductor device according to claim 18, wherein the memory cell structure further comprises:
  a TMO sidewall oxides, formed at sidewalls of the TMO layer, wherein the spacers are formed adjacent to the sidewalls of the TMO layer, and cover the TMO sidewall oxides and sidewalls of the top electrode.

21. The semiconductor device according to claim 18, wherein a width of the bottom electrode is larger than a width of the TMO layer and also larger than a width of the top electrode.

22. The semiconductor device according to claim 18, wherein the memory cell structure further comprises:
  a capping electrode formed on and directly contacting the top electrode,
  wherein the upper conducting layer is formed on and electrically connected to the capping electrode.

23. The semiconductor device according to claim 22, wherein a width of the capping electrode is larger than a width of the top electrode.

24. The semiconductor device according to claim 22, wherein the capping electrode covers top surfaces of the spacers.

* * * * *